United States Patent
Kim et al.

[11] Patent Number: 5,673,214
[45] Date of Patent: Sep. 30, 1997

[54] DISCRETE COSINE TRANSFORM PROCESSOR

[75] Inventors: Lee-Sup Kim, Dongdaemoon-Ku, Rep. of Korea; Tetsu Nagamatsu, Kawasaki; Takayasu Sakurai, Setagaya-Ku, both of Japan

[73] Assignee: Kabushiki Kaisha Toshiba, Tokyo, Japan

[21] Appl. No.: 704,922

[22] Filed: Aug. 28, 1996

Related U.S. Application Data

[63] Continuation of Ser. No. 346,817, Nov. 30, 1994, abandoned.

[30] Foreign Application Priority Data

Nov. 30, 1993 [JP] Japan ................... 5-300375

[51] Int. Cl.$^6$ ........................................ G06F 17/14
[52] U.S. Cl. .................... 364/725; 382/276; 382/250
[58] Field of Search .......................... 364/725, 750.5, 364/757–760; 382/166, 250, 276–279, 280, 281; 358/432

[56] References Cited

U.S. PATENT DOCUMENTS

| | | | |
|---|---|---|---|
| 4,791,598 | 12/1988 | Liou et al. | 364/725 |
| 5,181,183 | 1/1993 | Miyazaki | 364/725 |
| 5,249,146 | 9/1993 | Uramoto et al. | 364/725 |
| 5,319,724 | 6/1994 | Blonstein et al. | 382/56 |
| 5,361,220 | 11/1994 | Asano | 364/725 |

FOREIGN PATENT DOCUMENTS

| | | |
|---|---|---|
| 506111 | 9/1992 | European Pat. Off. . |
| 536062 | 4/1993 | European Pat. Off. . |

OTHER PUBLICATIONS

Arie Heiman, et al., "A Universal Real–Time Transformer for Image Coding", 1987 IEE Region 10 conference, vol. 2 of 3.

Chan S. Kim, et al., "200 Mega Pixel Rate IDCT Processor for HDTV Applications", 1993 IEEE, vol. 3. May 3–6, 1993.

Shin–ichi Uramoto, et al., "A 100MHz 2–D Discrete Cosine Transform Core Processor", pp. 35–36. No date.

M. Maruyama, et al., "VLSI Architecture and Implementation of a Multi–Function, Forward/Inverse Discrete Cosine Transform Processor", SPIE vol. 1360 Visual communications and Image Processing '90, pp. 410–417.

*Primary Examiner*—Reba I. Elmore
*Assistant Examiner*—Emmanuel L. Moise
*Attorney, Agent, or Firm*—Loeb & Loeb LLP

[57] ABSTRACT

Disclosed is an improved discrete cosine transform processor comprising an input unit for receiving image data to be processed, a storage unit for previously storing a result of a multiplication and accumulation calculation effected beforehand with respect to image input data and transform matrix components so that the same value is read from the same read line; a decoding unit for selecting the read line, in which each bit value of the image input data composed of a plurality of bits serves as a piece of address data; an accumulation unit for accumulating the data read from the storage unit and an output unit for outputting a result of the accumulation processing as output data. The storage unit uses the common data in common when effecting the multiplication and accumulation calculation, and, hence, a storage capacity is reduced, thereby making it possible to decrease a chip area.

3 Claims, 5 Drawing Sheets

DISCRETE COSINE TRANSFORM PROCESSOR

This is a continuation of application Ser. No. 08/346,817, filed Nov. 30, 1994, now abandoned.

BACKGROUND OF THE INVENTION

The present invention relates generally to a discrete cosine transform (DCT) processor and, more particularly, to a DCT processor suitable for use to compress and expand image data.

Roughly, two types of arithmetic methods have hitherto been conventionally employed for an LSI for performing arithmetic processing of a forward discrete cosine transform/inverse discrete cosine transform (FDCT/IDCT).

According to the first type of arithmetic method, the operation is effected by use of a multiplier in accordance with a definition expression of the FDCT/IDCT. That is, a ROM (read only memory) records precalculated transform coefficients of the FDCT/IDCT. The corresponding coefficients are sequentially read from this ROM, and the multiplier performs a multiplication and accumulation operation of this item of coefficient data and image data to be inputted. For example if an 8×8 pixel FDCT/IDCT processor is adopted, eight units of multipliers are used for effecting the operation in parallel, or alternatively, a single unit of multiplier is employed for performing a sequential operation.

The second type of arithmetic method is a distributed arithmetic (DA) method. This DA method was designed to avoid such an inconvenience that the multipliers occupy a large area on the LSI and to attain a higher operating speed. According to the DA method, multiplying the input image data by a cosine coefficient is not actually conducted by the multiplier, and, instead, an accumulation is effected by use of an adder after the ROM has stored a result of a precalculated multiplication and accumulation. This DA method is based on the premise that the ROM rather than the multiplier is capable of performing the same function with a smaller area on the LSI owing to an advancement of techniques for the semiconductor memory.

The DA method involves, in the case of, e.g., an 8×8 pixel FDCT/IDCT, the use of eight units of ROMs. A storage capacity required for each of the eight ROMs is $2^8 = 256$ words. Generally, an input to the FDCT processor is 9 bits per word, while an input to the IDCT processor is 12 bits per word. In any processor, however, one word is expanded to 16 bits in the interior of the processor.

Given herein is an explanation of an example of the conventional DCT processor for performing the DA processing. Note that a one-dimensional FDCT processor serving as a basis will be discussed. It is because a so-called two-dimensional DCT is attained by effecting a column-directional DCT with respect to (m×n) pixel sample data and further repeating a row-directional DCT with respect to a result of this transform.

In the case of the FDCT in which the DA processing is conducted, a transform formula of the one-dimensional FDCT is expressed as follows:

$$X(k) = (2/N)^{1/2} C(k) \sum_{m=0}^{N-1} x(m) \cos((2m+1)k\pi/2N),$$

$$k = 0, 1, 2, \ldots N-1$$

where $X(k)$ is the transform value, and $x(m)$ is the image data (sampling value series). In this formula, the terms $(2/N)^{1/2} C(k) \cos((2m+1)k\pi/2N)$ correspond to a coefficient matrix d. This is expressed in k-rows and in m-columns, e.g., 8-rows×8-columns corresponding to eight pieces of input data. The above transform formula is expressed in the next matrix form.

$$\begin{vmatrix} X_0 \\ X_1 \\ X_2 \\ \cdot \\ \cdot \\ \cdot \\ X_7 \end{vmatrix} = \begin{vmatrix} d_{11} & d_{12} & \ldots & d_{18} \\ d_{21} & d_{22} & & d_{28} \\ d_{31} & & & d_{38} \\ \cdot & & & \cdot \\ \cdot & & & \cdot \\ \cdot & & & \cdot \\ d_{81} & d_{82} & \ldots & d_{88} \end{vmatrix} \begin{vmatrix} x_0 \\ x_1 \\ x_2 \\ \cdot \\ \cdot \\ \cdot \\ x_7 \end{vmatrix}$$

The ROM stores a value $X_{0x}$ obtained by effecting multiplication and accumulation processing with respect to eight values ($d_{11}, d_{12}, \ldots d_{18}$) of the first row of this transform matrix d and values of input data $x$ (=$x_0, x_1, x_2, \ldots x_7$). In this case, one value $X_{0x}$ of the multiplication and accumulation in the first row is expressed such as ($d_{11}x_0 + d_{12}x_2 + d_{13}x_3 + \ldots d_{18}x_7$). When eight pieces (8 pixels) of input data $x$ are prepared, and if this item of input data is expressed by a binary value, each of the eight pieces input data $x_0, x_1, x_2, \ldots x_7$ may take a value of "0" or "1", and the input data $x$ and $2^8 = 256$ values. For this reason, 256 arithmetic values $X_0 - X_{255}$ are stored in a bank 0 defined as a first memory area of the ROM per row of the transform matrix d. Similarly, a bank 1 defined as a second memory area of the ROM stores 256 values obtained by performing the multiplication and accumulation arithmetic with respect to eight values $d_{21}, d_{22}, \ldots, d_{28}$ in the second row of the transform matrix d and the input data $x_0, x_1, x_2, \ldots x_7$. This processing is repeated up to the eighth row, and values obtained by effecting the multiplication and accumulation arithmetic are stored the banks 0-7 of the ROM. Each bank of the ROM is accessed by a common address signal, and storage data corresponding to the address is outputted from each bank. When the ROM each item of multiplication and accumulation data, this item of data is stored in a storage location corresponding to each of values of the input data $x_0, x_1, x_2, \ldots x_7$. With this processing, the input data $x$ are supplied as addresses to the ROM, whereby multiplication and accumulation arithmetic results (=$x_0, x_1, x_2, \ldots, x_7$) corresponding to the numerical values (=$x_0, x_1, x_2, \ldots x_7$) of the input data are outputted from the plurality of storage locations. Note that the contents (numerical values) of a transform table formed in the ROM differ according to the FDCT and IDCT.

FIG. 6 schematically illustrates LSI functional blocks for performing the DCT by the above-discussed DA processing. The input data $x_i$ defined as a serial pixel string obtained by effecting sampling of the image is, although a value of one pixel is expressed by 9 bits, for ensuring a required arithmetic accuracy needed, transformed into 16-bit data midways and supplied to a shift register 11. The shift register 11 transforms the serial data in parallel while shifting the pixel string of the input data in synchronism with an unillustrated system clock and supplies registers $12_0 - 12_7$. The registers $12_0 - 12_7$ take in outputs $x_i, x_{i+1}, x_{i+2}, \ldots, x_{i+7}$, of the shift register 11 that represent shift cycles of the input data for one pixel. Herein, the input data held in the registers $12_0 - 12_7$ correspond to the input data $x_0 - x_7$ of the above transform matrix. Based on the eight values of the input data $x_0 - x_7$, a decoder 13 accesses one of $2^8 = 256$ read signal lines $l_0 - l_{255}$, which corresponds to the value of the input data.

The decoder 13 can be, as illustrated in, e.g., FIG. 7, constructed of subdecoders $13a-13d$ supplied with the input data $x_0 - x_7$ and 4-input AND gates $G_0 - G_{255}$ inputting outputs of the respective subdecoders. Outputs of the AND gates $G_0$–$G_{255}$ are connected to the read signal lines $l_0$–$l_{255}$.

The subdecoder 13a is constructed of, as shown in, e.g., FIG. 8, four units of logic gate circuits and outputs "H" signals to the outputs corresponding to value combinations "00", "01", "10", "11" of two binary value inputs "$x_0 x_1$". The subdecoders 13b–13d are also similarly constructed.

This decoder 13 accesses any read signal lines corresponding to the input data $x_0$–$x_7$, thereby reading multiplication and accumulation data for the first row of the transform matrix, i.e., $d_{11}x_0 + d_{12}x_1 +, \ldots, d_{18}x_7$ stored in locations corresponding to the addresses $x_0$–$x_7$ of the bank 0 of a memory unit 14. Read is the multiplication and accumulation data for the second row of the transform matrix, i.e., $d_{21}x_0 + d_{22}x_1 +, \ldots, d_{28}X_7$ stored in locations corresponding to the addresses $x_0$ $x_7$ of the bank 1. Read is the multiplication and accumulation data for the third row of the transform matrix, i.e., $d_{31}x_0 + d_{32}x_1 +, \ldots, d_{38}X_7$ stored in locations corresponding to the addresses $x_0$ $x_7$ of the bank 2. Similarly, the multiplication and accumulation data corresponding to the fourth to eighth rows of the transform matrix are read from the banks 3–7. An accumulation processing unit 15 is supplied with the eight pieces of multiplication and accumulation data corresponding to the respective rows of the transform matrix, which are read from the individual banks of this memory unit 14. As stated above, the input data $x_i$ is composed of 16 bits, and, therefore, 16 pieces of outputs for a single item of input data are given forth from one bank. Then, the accumulation processing unit 15 repeats the accumulation of the output values from the banks by performing a digit shift corresponding to an in-process digit of the input data $x_i$, thereby obtaining transform data $X_i$ corresponding to the 16-bit data. This accumulation processing is conducted with respect to the output from each bank. With the accumulation processing, the transform data $X_0, X_1, X_2, \ldots X_7$ corresponding to the input data $x_0, x_1, x_2, \ldots x_7$ are obtained. These pieces of transform data are supplied to a shift register 16. The shift register 16 performs a parallel/serial transform of the data and serially outputs the transform data $X_0, X_1, X_2, \ldots X_7$ as output data to the outside in synchronism with the unillustrated system clock.

The above-mentioned DA method is a method of previously calculating a result of the multiplication in place of the multiplier occupying the large area and storing the ROM with the calculated result. Hence, whether this method is advantageous in terms of the area on the LSI depends on a size of the area of the ROM. For example, in the case of the 8×8 pixel FDCT/IDCT processor, the necessary capacity of the ROM is 256×8 words. This occupies a quite large area on the LSI, and, hence, the entire area can not be necessarily reduced.

SUMMARY OF THE INVENTION

Accordingly, it is primary object of the present invention to provide a discrete cosine transform processor capable of reducing an area of a ROM to the greatest possible degree when actualizing an LSI for performing arithmetic processing of a forward/inverse discrete cosine transform by a distributed arithmetic method.

According to the present invention, there is provided a discrete cosine transform processor comprising: input means for receiving image data to be processed; storage means for previously storing a result of a multiplication and accumulation calculation effected beforehand with respect to image input data and transform matrix components in a discrete cosine transform arithmetic so that the same value is read from the same read line; decoding means for selecting the read line, in which each bit value of the image input data composed of a plurality of bits serves as a piece of address data; accumulation means for accumulating the data read from said storage means; and output means for outputting a result of the accumulation processing as output data.

According to the present invention, the attention is paid to a redundancy of contents of a transform table formed in a storage area of the LSI for performing the forward/inverse discrete cosine transform by the distributed arithmetic method in order to reduce the storage area of a memory. That is, the transform table for holding a result of multiplication and accumulation arithmetic processing holds a plurality of the same values. Hence, a group of addresses for holding the same value access the same storage location within the transform table, thus using the data in common. A capacity of the transform table and therefore a storage capacity of the memory for holding this are thereby reduced. An area of a chip formed with the discrete cosine transform processor can be decreased to the greatest possible degree.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Figure 1:
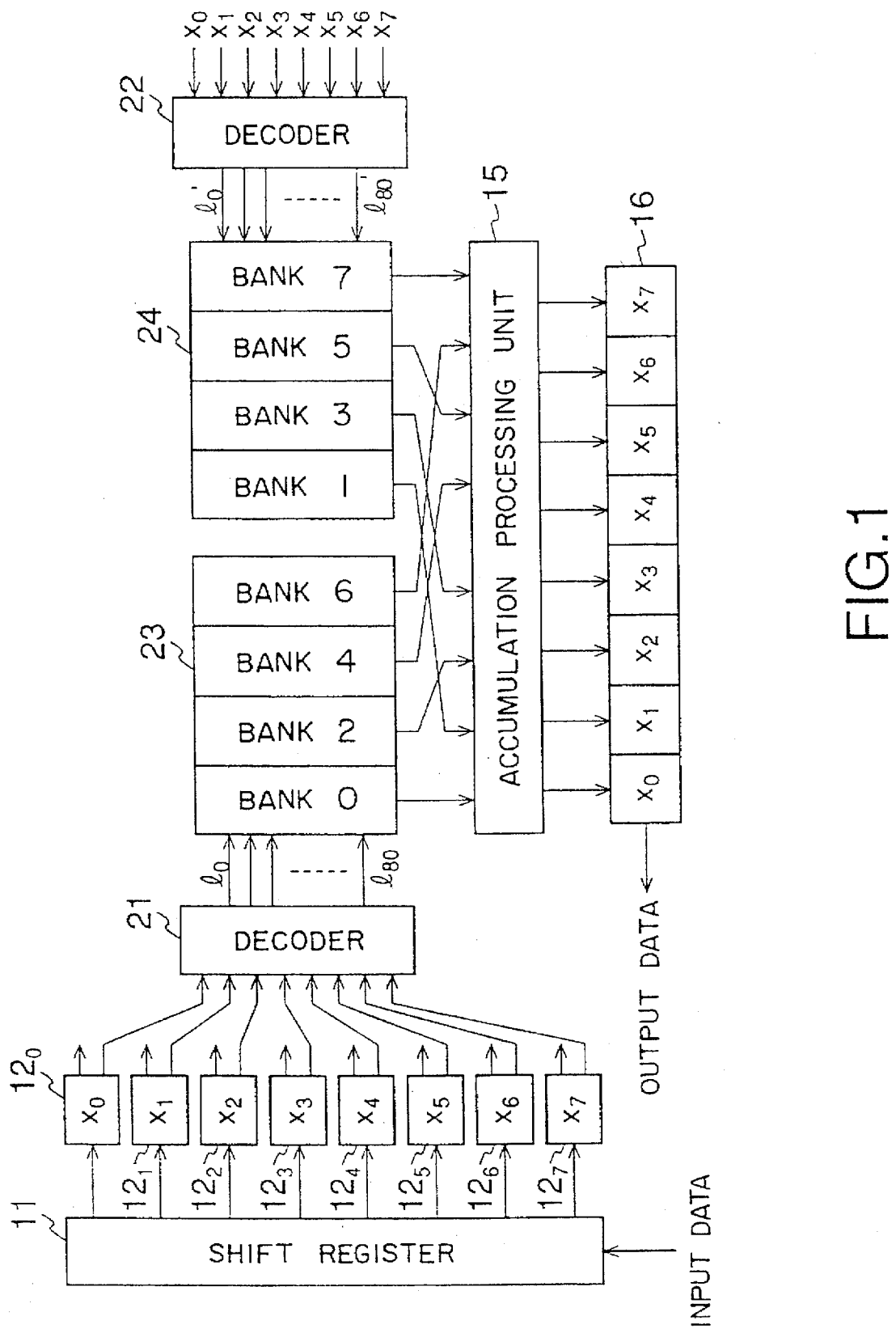
FIG. 1 is a block diagram illustrating an embodiment of a discrete cosine transform processor according to the present invention.

Embodiments of the present invention will hereinafter be discussed. To start with, a point to which the attention is paid according to the present invention will be explained. In the case of a forward discrete cosine transform (FDCT) for performing distributed arithmetic (DA) processing, a transform formula of a one-dimensional FDCT is, when input data consist of 8 pixels, as explained above, given such as:

$$\begin{vmatrix} X_0 \\ X_1 \\ X_2 \\ \cdot \\ \cdot \\ \cdot \\ X_7 \end{vmatrix} = \begin{vmatrix} d_{11} & d_{12} & \ldots & d_{18} \\ d_{21} & d_{22} & & d_{28} \\ d_{31} & & & d_{38} \\ \cdot & & & \cdot \\ \cdot & & & \cdot \\ \cdot & & & \cdot \\ d_{81} & d_{82} & \ldots & d_{88} \end{vmatrix} \begin{vmatrix} x_0 \\ x_1 \\ x_2 \\ \cdot \\ \cdot \\ \cdot \\ x_7 \end{vmatrix}$$

Herein, (8×8) pieces of numerical values of a transform matrix $d_{11}, d_{12}, d_{13}, \ldots d_{88}$ will be expressed in decimal values as follows:

$$\begin{vmatrix} 1.0000 & 1.0000 & 1.0000 & 1.0000 & 1.0000 & 1.0000 & 1.0000 & 1.0000 \\ 1.3870 & 1.1759 & 0.7857 & 0.2759 & -0.2759 & -0.7857 & -1.1759 & -1.3870 \\ 1.3066 & 0.5412 & -0.5412 & -1.3066 & -1.3066 & -0.5412 & -0.5412 & 1.3066 \\ 1.1759 & -0.2759 & -1.3870 & -0.7857 & 0.7857 & 1.3870 & 0.2759 & -1.1759 \\ 1.0000 & -1.0000 & -1.0000 & 1.0000 & 1.0000 & -1.0000 & -1.0000 & 1.0000 \\ 0.7857 & -1.3870 & 0.2759 & 1.1759 & -1.1759 & -0.2759 & 1.3870 & -0.7857 \\ 0.5412 & -1.3066 & 1.3066 & -0.5412 & -0.5412 & 1.3066 & -1.3066 & 0.5412 \\ 0.2759 & -0.7857 & 1.1759 & -1.3870 & 1.3870 & -1.1759 & 0.7857 & -0.2759 \end{vmatrix}$$

As stated above, the ROM stores values obtained by the effecting the multiplication and accumulation arithmetic with respect to the eight values in the first row of this transform matrix d and "0" and "1" of the binary value input data $x_0, x_1, x_2, \ldots x_7$. In this case, one value of the multiplication and accumulation in the first row is expressed such as $d_{11}x_0+d_{12}x_2+d_{13}x_3+\ldots d_{18}x_7$. When eight pieces (eight pixels) of input data are prepared, these pieces of input data $x_0, x_1, x_2, \ldots x_7$ have $2^8=256$ values. For this reason, the ROM stores the 256 arithmetic values per row of the transform matrix. In the same way, the ROM stores values obtained by performing the multiplication and accumulation arithmetic with respect to the eight values in the second row of the transform matrix d and the input data $x_0, x_1, x_2, \ldots x_7$. This processing is repeated up to the eighth row, and the values undergoing the multiplication and accumulation arithmetic are stored in the ROM. Respective items of multiplication and accumulation data are stored in such ROM storage locations that the input data $x_0, x_1, x_2, \ldots x_7$ in the multiplication and accumulation arithmetic serve as addresses. With this processing, the input data are supplied as the addressed to the ROM, whereby multiplication and accumulation arithmetic results corresponding to the numerical values of the input data are outputted from the storage locations.

By the way, when observing coefficient values of the above transform matrix d, it can be known that there is the following regularity. That is:

1) with respect to the second, fourth, sixth and eighth rows, the individual values of the first, second, third and fourth columns are the same in their absolute values but different in their symbols from those of the eight, seventh, sixth and fifth columns; and 2) with respect to the first, third, fifth and seventh rows, the individual values of the first, second, third and fourth columns are the same as the values of the eighth, seventh, sixth and fifth columns.

Based on such a regularity, the multiplication and accumulation data corresponding to the 8-pixel input data are stored by 256 pieces in each of the eight banks, and a plurality of the same values are contained in each bank of the storage unit 14.

For instance, a multiplication and accumulation calculation with respect to the second row of the transform matrix d and the input data ($=x_0, x_1, x_2, \ldots x_7$) is given by:

$$1.3870x_0+1.1759x_1+0.7857x_2+0.2759x_3-0.2759x_4-0.7857x_5-1.1759x_6-1.3870x_7$$

This can be, when transformed, expressed such as:

$$=1.3870(x_0-x_7)+1.1759(x_1-x_6)+0.7857(x_2-x_5)+0.2759(x_3-x_4)$$

From the expression, when both of $x_0$ and $x_7$ in the input data x are "0", and when both of $x_0$ and $x_7$ are "1", the first term becomes "0". Hence, if other input data $x_1, x_2, \ldots, x_6$ are equal, the results of the multiplication and accumulation calculations take the same values.

For example, when the input data is "01101100", and when the input data x is "11101101", both of the values of the multiplication and accumulations are 0.9.

Similarly, when both of $x_2$ and $x_6$ in the input data x are "0", and when both of $x_1$ and $x_6$ are "1", the results of the multiplication and accumulation calculations become the same values if other input data $x_0, x_2, \ldots, x_5, x_7$ are equal. When both of $x_2$ and $x_5$ in the input data x are "0", and when both of $x_2$ and $x_5$ are "1", the results of the multiplication and accumulation calculations become the same values if other input data $x_0, x_1, \ldots, x_4, x_5, x_7$ are equal. When both of $x_3$ and $x_4$ in the input data x are "0", and when both of $x_5$ and $x_6$ are "1", the results of the multiplication and accumulation calculations become the same values if other input data $x_0, x_1, x_2, x_5, x_6, x_7$ are equal.

Accordingly, if input data "$0 \cdot x_1 x_2 x_3 x_4 x_5 x_6 \cdot 0$" and input data "$1 \cdot x_1 x_2 x_3 x_4 x_5 x_6 \cdot 1$" access the same address, any one item of input data may not be held. With this processing, four 1st- and 8th-bit combinations "00", "01", "10", "11" turn out three combinations, i.e., one combination "00" or "11" plus two combinations "01", "10". When having the data of the same value in common, for the 256 storage locations designated by the 8-bit input data $x_0 x_1 x_2 x_3 x_4 x_5 x_6 x_7$, $256 \times (\frac{3}{4}) = 192$ storage locations may suffice.

Further, if input data "$x_0 \cdot 0 \cdot x_2 x_3 x_4 x_5 \cdot 0 \cdot x_7$" and input data "$x_0 \cdot 1 \cdot x_2 x_3 x_4 x_5 \cdot 1 \cdot x_7$" access the same address, any one item of input data may not be held. With this processing, four 2nd- and 7th-bit combinations "00", "01", "10", "11" turn out three combinations, i.e., one combination "00" or "11" plus two combinations "01", "10". When having the data of the same value in common, for the 256 storage locations designated by the 8-bit input data $x_0 x_1 x_2 x_3 x_4 x_5 x_6 x_7$, $256 \times (\frac{3}{4}) \times (\frac{3}{4}) = 144$ storage locations may suffice.

Similarly, it is assumed to have the data of the same value. If input data "$x_0 x_1 \cdot 0 \cdot x_3 x_4 \cdot 0 \cdot x_6 x_7$" and input data "$x_0 x_1 \cdot 1 \cdot x_3 x_4 \cdot 1 \cdot x_6 x_7$" access the same address, and further if input data "$x_0 x_1 x_2 \cdot 0 \cdot 0 \cdot x_5 x_6 x_7$" and input data "$x_0 x_1 x_2 \cdot 1 \cdot 1 \cdot x_5 x_6 x_7$" access the same address, for the 256 storage locations designated by the above 8-bit input data $x_0 x_1 x_2 x_3 x_4 x_5 x_6 x_7$, $256 \times (\frac{3}{4}) \times (\frac{3}{4}) \times (\frac{3}{4}) \times (\frac{3}{4}) = 81$ storage locations may suffice. Hence, the ROM capacity can be reduced.

Each of even-numbered rows of the transform matrix d has the same regularity, and, therefore, the consideration about the above second row is applicable to other even-numbered rows. Eighty one arithmetic values per even-numbered row are stored in each of the four banks, corresponding to each row. The thus stored arithmetic values can be accessed by a signal unit of decoder.

Next, the regularity of odd-numbered rows of the transform matrix will be explained. A multiplication and accumulation calculation with respect to the third row of the transform matrix d and the input data ($=x_0, x_1, x_2, \ldots x_7$) is given by:

$1.3066x_0+0.5412x_1-0.5412x_2-1.3066x_3-1.3066x_4-0.5412x_5+0.5412x_6+1.3066x_7$

This can be, when transformed, expressed such as:

$=1.3066(x_0+x_7)+0.5412(x_1+x_6)-0.5412(x_2+x_5)-1.3066(x_3+x_4)$

From this expression, when $x_0$ is "0" and $x_7$ is "1", and when $x_0$ is "1" and $x_7$ IS "0", both of the first terms are "1.3066". Hence, if other input data $x_1, x_2, \ldots, x_6$ are equal, the results of the multiplication and accumulation calculations take the same values.

For example, when the input data is "01101101", and when the input data x is "11101100", both of the values of the multiplication and accumulation calculations are −0.5412.

Similarly, when both of $x_1$ and $x_6$ in the input data x are "0" and "1", and when both of $x_1$ and $x_6$ are "1" and "0", the results of the multiplication and accumulation calculations become the same values if other input data $x_0, x_2, \ldots, x_5$, $x_7$ are equal. When both of $x_2$ and $x_6$ in the input data x are "0" and "1", and when both of $x_2$ and $x_5$ are "1" and "0", the results of the multiplication and accumulation calculations become the same values if other input data $x_0, x_1, \ldots, x_4$, $x_6, x_7$ are equal. When both of $x_3$ and $x_4$ in the input data x are "0" and "1", and when both of $x_3$ and $x_4$ are "1" and "0", the results of the multiplication and accumulation calculations become the same values if other input data $x_0, x_1, x_2$, $x_5, x_6, x_7$ are equal.

Accordingly, if input data "$0 \cdot x_1 x_2 x_3 x_4 x_5 x_6 \cdot 1$" and input data "$1 \cdot x_1 x_2 x_3 x_4 x_5 x_6 \cdot 0$" access the same address, any one item of input data may not be held. With this processing, the four 1st- and 8th-bit combinations "00", "01", "10", "11" turn out three combinations, i.e., one combination "01" or "10" plus two combinations "00", "11". When having the data of the same value in common, for the 256 storage locations designated by the 8-bit input data $x_0x_1x_2x_3x_4x_5x_6x_7$, 256×(¾)=192 storage locations may suffice.

Further, if input data "$x_0 \cdot 0 \cdot x_2 x_3 x_4 x_5 \cdot 1 \cdot x_7$" and input data "$x_0 \cdot 1 \cdot x_2 x_3 x_4 x_5 \cdot 0 \cdot x_7$" access the same address, any one item of input data may not be held. With this processing, the four 2nd- and 7th-bit combinations "00", "01", "10", "11" turn out three combinations, i.e., one combination "01" or "10" plus two combinations "00", "11". When having the data of the same value in common, for the 256 storage locations designated by the 8-bit input data $x_0x_1x_2x_3x_4x_5x_6x_7$, 256× (¾)×(¾) =144 storage locations may suffice.

Similarly, it is assumed to have the data of the same value. If input data "$x_0x_1 \cdot 0 \cdot x_3x_4 \cdot 1 \cdot x_6x_7$" and input data "$x_0x_1 \cdot 1 \cdot x_3x_4 \cdot 0 \cdot x_6x_7$" access the same address, and further if input data "$x_0x_1x_2 \cdot 0 \cdot 1 \cdot x_5x_6x_7$" and input data "$x_0x_1x_2 \cdot 1 \cdot 0 \cdot x_5x_6x_7$" access the same address, for the 256 storage locations designated by the above 8-bit input data $x_0x_1x_2x_3x_4x_5x_6x_7$, 256×(¾)×(¾)×(¾)×(¾)=81 storage locations may suffice. Hence, the ROM capacity can be reduced.

Each of odd-numbered rows of the transform matrix d has the same regularity, and, therefore, the consideration about the above third row is applicable to other odd-numbered rows. Eighty one arithmetic values per odd-numbered row are stored in each of the four banks, corresponding to each row. The thus stored arithmetic values can be accessed by a single unit of decoder.

FIG. 1 schematically illustrates functional blocks of the LSI for performing the DCT by the DA processing according to the present invention. The elements corresponding to those of the conventional processor in the embodiment shown in FIG. 1 are marked with the like symbols, and explanations of such elements will be omitted.

In accordance with this embodiment, the conventional storage unit 14 is replaced with a plurality of memory units, i.e., two memory units 23 and 24 corresponding to, e.g., the multiplication and accumulation calculation of the even-numbered rows of the transform matrix d and the multiplication and accumulation calculation of the odd-numbered rows thereof. The memory unit 23 takes the charge of a group of the even-numbered banks and holds multiplication and accumulation arithmetic results of the even-numbered rows. The memory unit 24 takes the charge of a group of the odd-numbered bank elements and holds multiplication and accumulation arithmetic results of the odd-numbered rows. The memory unit 23 is accessed by a decoder 21 for decoding the even-numbered banks. The memory unit 24 is accessed by a decoder 22 for decoding the odd-numbered banks. A single unit of ROM (memory) comprises the decoder 21 and the memory unit 23. The decoder 22 and the memory unit 24 also constitute another unit of ROM (memory).

Referring to FIG. 1, to begin with, a series of input data are serial/parallel-converted through the shift register 11 and then held in registers $12_0$–$12_7$. Values of eight pieces of input data $x_0$–$x_7$ of the registers $12_0$–$12_7$ are supplied as address signals to the decoders 21, 22.

The decoder 21 can be constructed of a subdecoder 21a supplied with the input data $x_0x_7$ and a subdecoderr 21b supplied with the input data $x_1x_6$. The decoder 21 is also constructed of a subdecoder 21c supplied with the input data $x_2x_3$, a subdecoder 21d supplied with the input data $x_3x_4$ and 4-input AND gates $G_0$–$G_{80}$ inputting the outputs of the respective subdecoders. The outputs of the AND gates $G_0$–$G_{80}$ are connected to read signal lines $l_0$–$l_{80}$.

Figure 3:
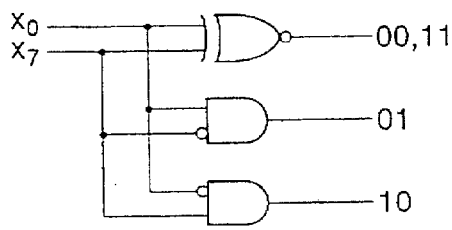
FIG. 3 is a circuit diagram showing a configurational example of a subdecoder.

The subdecoder 21a is composed of, e.g., as illustrated in FIG. 3, a logic gate circuit including an exclusive NOR gate and AND gates inputting inverted values on one sides. Then, "H" signals are outputted to output terminal corresponding to value combinations "00", "01", "10", "11" of two binary value inputs "$x_0x_7$". However, when the input data $x_0x_7$ is "00" or "11" by the exclusive NOR gate, the "H" signals are outputted to the same output terminals. The subdecoder 21a has three output terminals that are less by one than the output terminal number 4 of the conventional subdecoder 13a. Other subdecoders 21b–21d are likewise constructed.

The outputs of this decoder 21 are supplied to the respective banks of the memory unit 23 via the read signal lines $l_0$–$l_{80}$. The decoder 21 accesses some of the read signal lines $l_0$–$l_{80}$ that correspond to the values of the input data $x_0$–$x_7$ supplied. The decoder 21 then reads out data about a multiplication and accumulation with respect to the input data and coefficient values of the second, fourth, sixth and eighth rows of the transform matrix d which are stored in the first bank (bank 0), the second bank (bank 2), the third bank (bank 4) and the fourth bank (bank 6) of the memory unit 23. The point to which the attention is paid according to the present invention is, as already explained, that the memory unit 23 previously holds one set of values of the multiplication and accumulation calculations to share the data with respect to those having the same values of the multiplication and accumulation calculations in the respective even-numbered rows of the transform matrix d. Then, the decoder 21 accesses the same storage location with respect to a set of input data (address) having the same value of the multiplication and accumulation calculation. Supplied to the corresponding input terminals of the accumulation processing unit 15 in sequence are four pieces of multiplication and accumulation data corresponding to the respective even-numbered rows of the transform matrix that are read from the individual banks of the memory unit 23.

Figure 2:
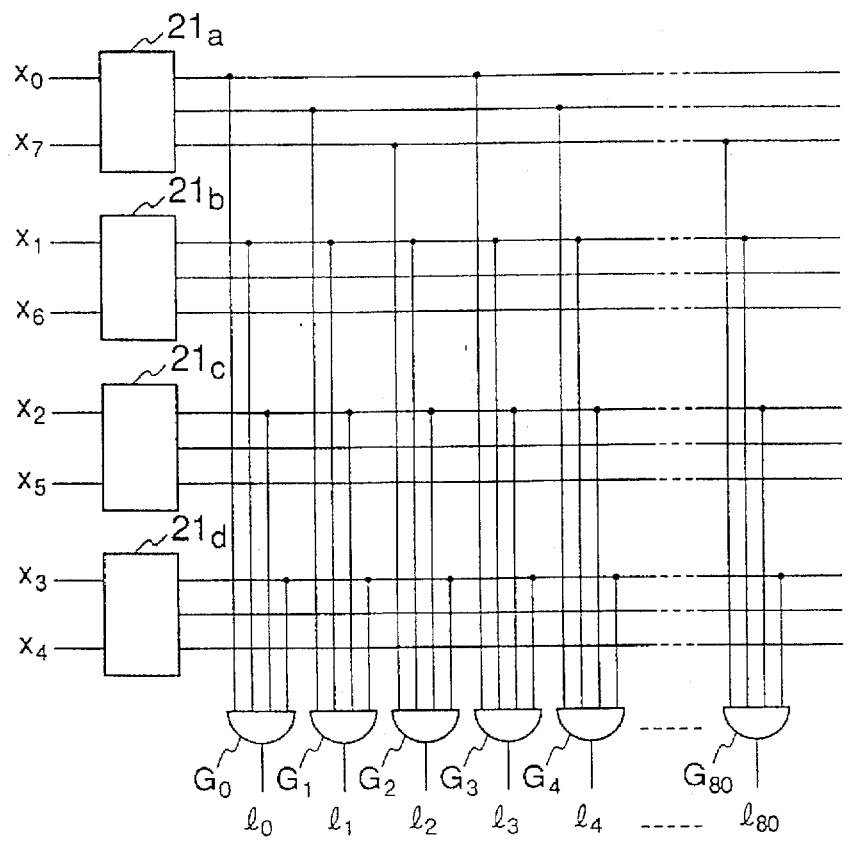
FIG. 2 is a block circuit diagram showing a configurational example of a decoder.

The decoder 22 is, as in the same way with the decoder 21 shown in FIG. 2, constructed of subdecoders and AND gates. Output terminals of the AND gates $G_0$–$G_{80}$ are connected to read signal lines $l_0'$–$l_{80}'$. The decoder 22, however, includes subdecoders 22a–22d (unillustrated) in place of the subdecoders 21a–21d.

Figure 4:
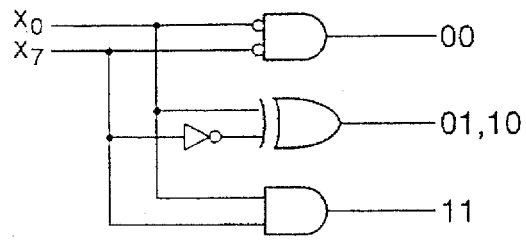
FIG. 4 is a circuit diagram showing another configurational example of the subdecoder.

The subdecoder 22a can be composed of, e.g., as illustrated in FIG. 4, an AND gate (NOR gate) inputting an inverted value, an inverter, an exclusive OR gate and an AND gate. Then, the "H" signals are outputted to the output terminals corresponding to the value combinations "00", "01", "10", "11" of the two binary value inputs. However, the input data $x_0x_7$ is "01" or "10" by the exclusive NOR gate, the "H" signal is outputted to the same second output terminal. The subdecoder 22a has three output terminals that are less by one than the output terminal number 4 of the conventional subdecoder 13a. The subdecoders 22b–22d are similarly constructed.

The outputs of this decoder 22 are supplied to the respective banks of the memory unit 24 via the read signal lines $l_0'$–$l_{80}'$. The decoder 22 accesses some of the read signal lines $l_0'$–$l_{80}'$ that correspond to the values of the input data $x_0$–$x_7$ supplied. The decoder 22 then reads out data about a multiplication and accumulation with respect to the input data and coefficient values of the first, third, fifth and seventh rows of the transform matrix d which are stored in the first bank (bank 1), the second bank (bank 3), the third bank (bank 5) and the fourth bank (bank 7) of the memory unit 24. The memory unit 24 previously holds one set of values of the multiplication and accumulation calculations to share the data with respect to those having the same values of the multiplication and accumulation calculations in the respective odd-numbered rows of the transform matrix d. Then, the decoder 22 accesses the same storage location with respect to a set of input data (address) having the same value of the multiplication and accumulation calculation. Supplied to the corresponding input terminals of the accumulation processing unit 15 in sequence are four pieces of multiplication and accumulation data corresponding to the respective odd-numbered rows of the transform matrix that are read from the individual banks of the memory unit 24.

The accumulation processing unit 15 is supplied with eight pieces of multiplication and accumulation data corresponding to the respective rows of th transform matrix that are read from the individual banks of the memory units 23, 24. As described above, the input data $x_i$ consists of 16 bits, and, hence, 16 pieces of outputs with respect to one item of input data are given forth from one bank. Then, the accumulation processing unit 15 effects the digit shift corresponding to the in-process digit of the input data $x_i$ and repeats the accumulation of the bank output values, thereby obtaining an item of transform data $X_i$ corresponding to the 16-bit data. This accumulation processing is conducted for the output from each bank. Pieces of transform data $X_1$, $X_2$, ..., $X_7$ corresponding to the input data $x_0$, $x_1$, $x_2$, ..., $x_7$ are obtained by the accumulation processing. These pieces of transform data are supplied to the shift register 16. The shift register 16 performs the parallel/serial transform of the data and outputs the transform data $X_1$, $X_2$, ..., $X_7$ as output data to the outside in synchronism with the unillustrated system clock.

In accordance with this first embodiment, although the single bank of the ROM has to hold the 256 pieces of data in the prior art, it may suffice that one bank of the ROM holds 81 pieces of data, whereby the are of the ROM can be reduced.

Note that the memory for holding the results of the multiplication and accumulation arithmetic generally involves the use of the ROM. As a matter of course, however, a variety of usable memories like so-called flash memories are RAM, PROM, EPROM,$E^a$-PROM such as DRAM, SRAM. The above memory is not confined to a specific ROM.

Further, in the embodiment discussed above, the regularity in the coefficient matrix d is common to the odd-numbered rows as well as to the even-numbered rows, and, therefore, the two 4-bank based memory units 23, 24 are employed. This may be also constructed by use of eight units of ROMs corresponding to the respective rows of the coefficient matrix d. In this case, the multiplication and accumulation data can be commonized by constituting the decoder corresponding to the individual regularity with respect to each row.

Given next is an explanation of an applied example of other DA processing according to the present invention. The embodiment discussed above has presented the case where the present invention is applied to the FDCT. This invention is also applicable to the IDCT. A coefficient matrix in a definition expression of the IDCT is given by:

$$\begin{vmatrix} 1.0000 & 1.3870 & 1.3066 & 1.1759 & 1.0000 & 0.7857 & 0.5412 & 0.2759 \\ 1.0000 & 1.1759 & 0.5412 & -0.2759 & -1.0000 & -1.3870 & -1.3066 & -0.7857 \\ 1.0000 & 0.7857 & -0.5412 & -1.3870 & -1.0000 & 0.2759 & 1.3066 & 1.1759 \\ 1.0000 & 0.2759 & -1.3066 & -0.7857 & 1.0000 & 1.1759 & -0.5412 & -1.3870 \\ 1.0000 & -0.2759 & -1.3066 & 0.7857 & 1.0000 & -1.1759 & -0.5412 & 1.3870 \\ 1.0000 & -0.7857 & -0.5412 & 1.3870 & -1.0000 & -0.2759 & 1.3066 & -1.1759 \\ 1.0000 & -1.1759 & 0.5412 & 0.2759 & -1.0000 & 1.3870 & -1.3066 & 0.7857 \\ 1.0000 & -1.3870 & 1.3066 & -1.1759 & 1.0000 & -0.7857 & 0.5412 & -0.2759 \end{vmatrix}$$

In this case also, though not so conspicuous in the FDCT, a given regularity can ben seen. That is, the absolute value in the first and second columns of each row are equal to each other. Accordingly, for instance, when giving an observation about the first row, the multiplication and accumulation calculation will be given as follows:

$1.0000x_0 + 1.3870x_1 + 1.3066x_2 + 1.1759x_3 + 1.0000x_4 + 0.7858x_5 + 0.5412x_6 + 0.2759x_7$

This can be, when transformed, expressed such as:

$= 1.0000(x_0 + x_4) + 1.3870x_1 + 1.3066x_2 + 1.1759x_3 + 0.7857x_5 + 0.5412x_6 + 0.2759x_7$

From this expression, when $x_0=0$ and $x_4=1$, and when $x_0=1$ and $x_4=0$, the results of the multiplication and accumulation calculations are the same. This is established with respect to the fourth, fifth and eighth rows. If input data "$0 \cdot x_1 x_2 x_3 \cdot 1 \cdot x_4 x_5 x_6 x_7$" and input data "$1 \cdot x_1 x_2 x_3 \cdot 0 \cdot x_4 x_5 x_6 x_7$" access the same address, any one item of input data may not be held. With this processing, four 1st-bit $x_0$ and 8th-bit $x_4$ combinations "00", "01", "10", "11" turn out three combinations, i.e., one combination "01" or "10" plus two combinations "00", "11".

Figure 5:
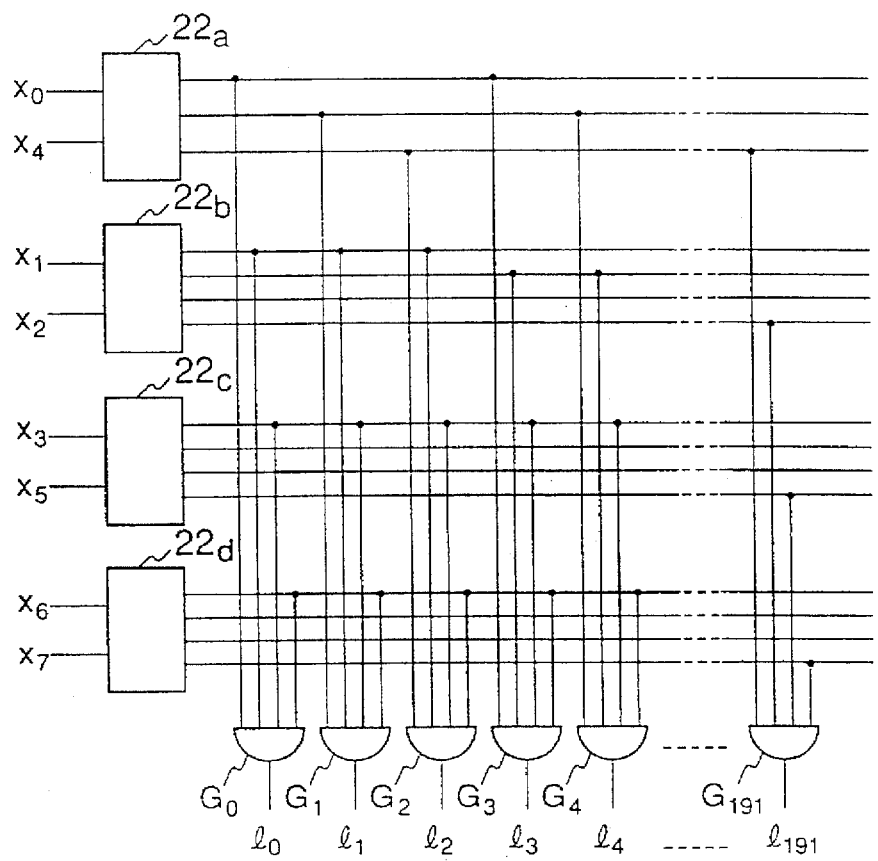
FIG. 5 is a block circuit diagram illustrating a configurational example of the decoder in another embodiment.
Figure 6:
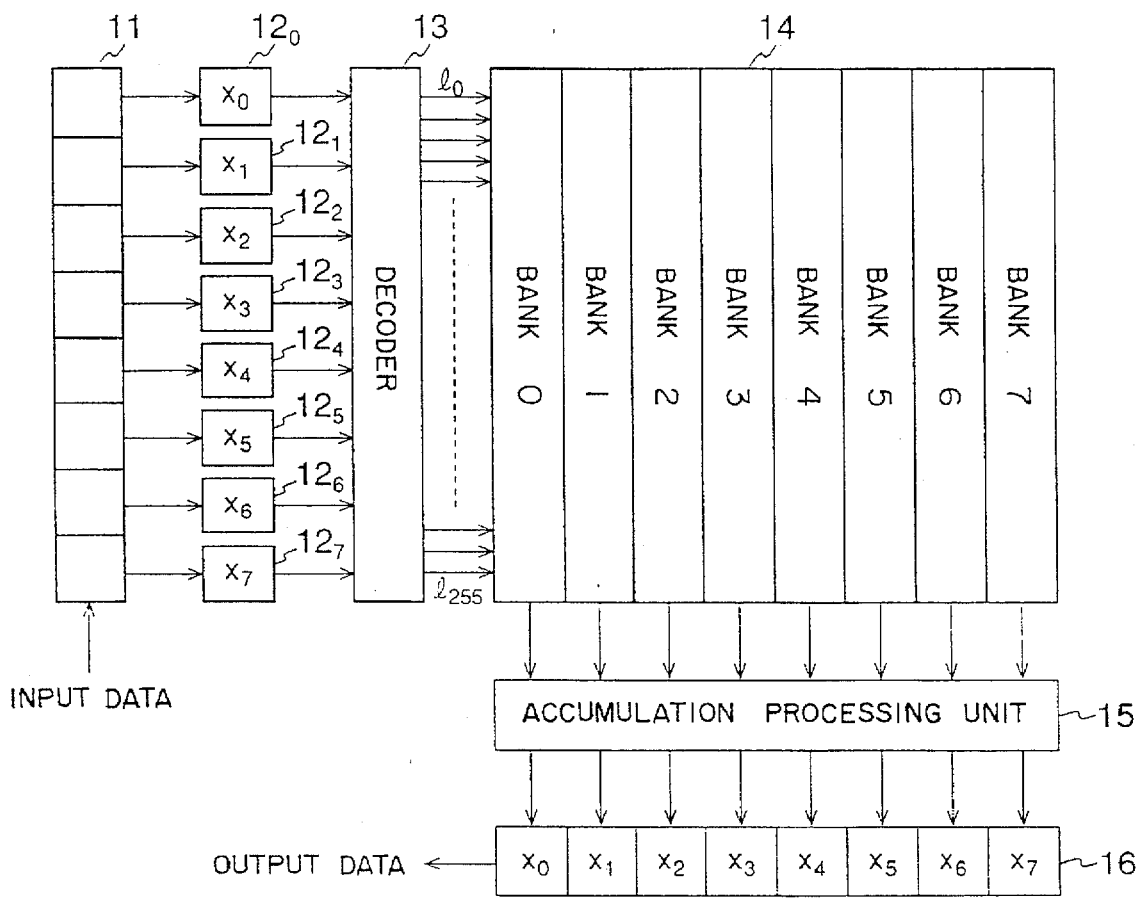
FIG. 6 is a block diagram illustrating an example of a conventional discrete cosine transform processor.
Figure 7:
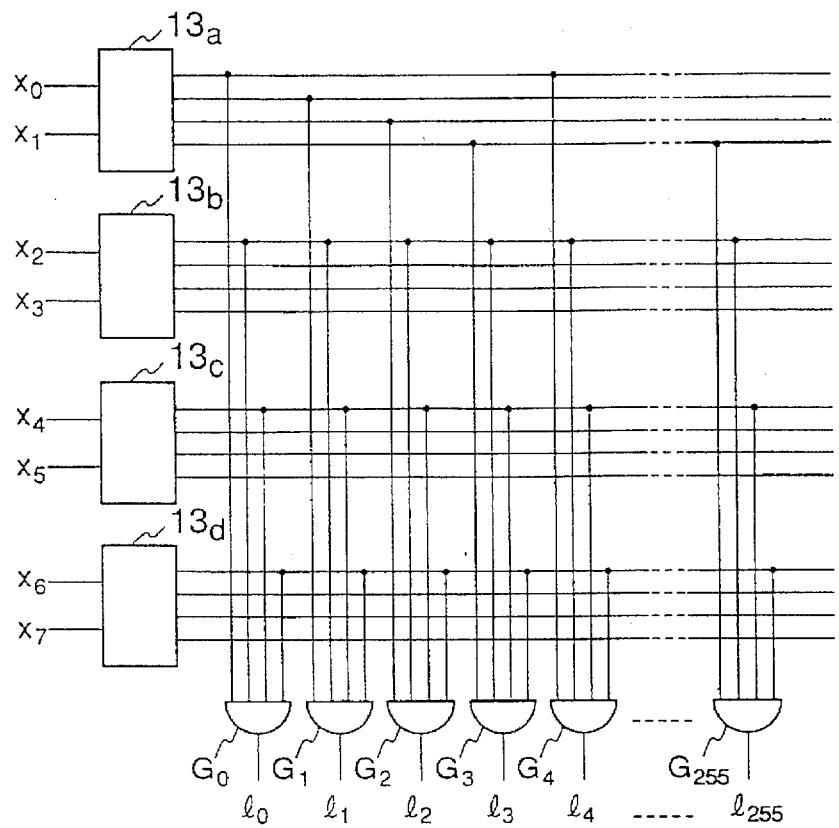
FIG. 7 is a block circuit diagram illustrating a configurational example of a decoder of the conventional discrete cosine transform processor.
Figure 8:
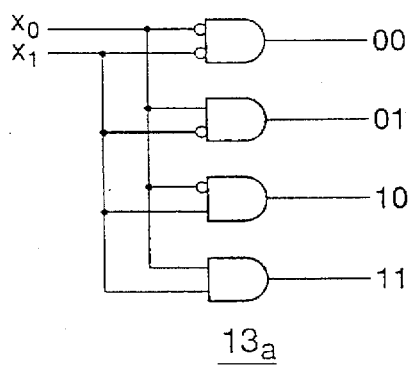
FIG. 8 is a circuit diagram showing a configurational example of a subdecoder of the conventional decoder.

This, as a decoder of each of the ROMS that work in such a manner and correspond to the first, fourth, fifth and eighth rows, can be actualized, as illustrated in FIG. 5, by replacing one of the subdecoders of the conventional decoder (FIG. 7) with the subdecoder 22a shown in FIG. 4. Referring to FIG. 5, the elements corresponding to those of the conventionally constructed decoder depicted in FIG. 7 are marked with the like symbols, and their explanations will be omitted.

As discussed above, when having the data of the same value in common, for the 256 storage locations designated by the 8-bit input data $x_0x_1x_2x_3x_4x_5x_6x_7$, 256×(¾)=192 storage locations may suffice.

Further, when giving an observation about the second row, a multiplication and accumulation calculation is given by:

$$1.0000x_0+1.1759x_1+0.5412x_2-0.2759x_3-1.0000x_4-1.3870x_5-1.3066x_6-0.7857x_7$$

This can be, when transformed, expressed such as:

$$=1.0000(x_0-x_4)+1.1759x_1+0.5412x_2-0.2759x_3-1.3870x_5-1.3066x_6-0.7857x_7$$

From this expression, when $x_0=0$ and $x_4=0$, and when $x_0=1$ and $x_4=1$, the results of the multiplication and accumulation calculations are the same. This is established with respect to the third, sixth and seventh rows. If input data "$0 \cdot x_1x_2x_3 \cdot 0 \cdot x_4x_5x_6x_7$" and input data "$1 \cdot x_1x_2x_3 \cdot 1 \cdot x_4x_5x_6x_7$" access the same address, any one item of input data may not be held. With this processing, four 1st-bit $x_0$ and 8th-bit $x_4$ combinations "00", "01", "10", "11" turn out three combinations, i.e., one combination "11" or "00" plus two combinations "01", "10".

This, as a decoder of each of the ROMs corresponding to the second, third, sixth and seventh rows, can be actualized by replacing the subdecoder 22a of the decoder shown in FIG. 5 with the subdecoder 21a illustrated in FIG. 3. The ROM subdecoders corresponding to these rows have the data in common, whereby 256×(¾)=192 storage locations may suffice in stead of the 256 storage locations designated by the 8-bit input data $x_0x_1x_2x_3x_4x_5x_6x_7$.

The DCT for effecting the matrix arithmetic entails an execution of a large amount of sum of calculations, and, hence, an efficient arithmetic method is demanded. One of such methods may be a high-seed algorithm using a butterfly adder as fully described in, e.g., Japanese Patent Application No. 5-267376. The FDCT based on this high-speed algorithm is expressed by the following formula. The present invention is also applicable to the DCT for performing such an arithmetic operation.

$$\begin{vmatrix} X_0 \\ X_2 \\ X_4 \\ X_6 \end{vmatrix} = (1/2) \begin{vmatrix} A & A & A & A \\ B & C & -C & -B \\ A & -A & -A & A \\ C & -B & B & -C \end{vmatrix} \begin{vmatrix} X_0+X_7 \\ X_1+X_6 \\ X_2+X_5 \\ X_3+X_4 \end{vmatrix}$$ EVEN NUMBER $$\begin{vmatrix} X_1 \\ X_3 \\ X_5 \\ X_7 \end{vmatrix} = (1/2) \begin{vmatrix} D & E & F & G \\ E & -G & -D & -F \\ F & -D & G & E \\ G & -F & E & -D \end{vmatrix} \begin{vmatrix} X_0-X_7 \\ X_1-X_6 \\ X_2-X_5 \\ X_3-X_4 \end{vmatrix}$$ ODD NUMBER where the respective coefficients of the transform matrix are A=cos π/4, B=cos π/8, C=sin π/8, D=cos π/16, E=cos 3π/16, F=sin 3π/16, and G=sin π/16.

In the case of the above even-numbered transform matrix, the coefficients of the first and fourth columns bear such a relationship that their absolute values are equal. Further, absolute values of the second and third columns are also equal. Accordingly, as explained above, the decoder circuit makes use of the exclusive OR and the exclusive NOR, and the same storage location for the input value (an added value of $x_i+x_{i+1}$) having the same multiplication and accumulation value is accessed, thereby reducing a duplication of the memory data to decrease the ROM area.

Further, the present invention can be also applied to the IDCT using the butterfly adder. In this case, the transform matrix is expressed by the following formula:

$$\begin{vmatrix} X_0 \\ X_2 \\ X_4 \\ X_6 \end{vmatrix} = (1/2) \begin{vmatrix} A & A & A & C \\ A & -C & -A & B \\ A & -B & A & -C \\ A & C & -A & -B \end{vmatrix} \begin{vmatrix} X_0 \\ X_2 \\ X_4 \\ X_6 \end{vmatrix} + (1/2) \begin{vmatrix} D & E & F & G \\ F & -D & G & E \\ -G & F & -E & D \\ -E & G & D & F \end{vmatrix} \begin{vmatrix} X_1 \\ X_3 \\ X_5 \\ X_7 \end{vmatrix}$$

$$\begin{vmatrix} X_1 \\ X_3 \\ X_5 \\ X_7 \end{vmatrix} = (1/2) \begin{vmatrix} A & C & -A & -C \\ A & -B & A & -B \\ A & -C & -A & B \\ A & B & A & C \end{vmatrix} \begin{vmatrix} X_0 \\ X_2 \\ X_4 \\ X_6 \end{vmatrix} - (1/2) \begin{vmatrix} -E & G & D & F \\ -G & F & -E & D \\ F & -D & G & E \\ D & E & F & G \end{vmatrix} \begin{vmatrix} X_1 \\ X_3 \\ X_5 \\ X_7 \end{vmatrix}$$

where the respective coefficients of the transform matrix are A=cos π/4, B=cos π/8, C=sin π/8, D=cos π/16, E=cos 3π/16, F=sin 3π/16, and G=sin π/16.

In the two matrices with respect to the even-numbered input data $X_0X_2X_4X_6$ in the above formula, absolute values of the coefficients of the first and third columns are equal. Accordingly, as explained above, the decoder circuit makes use of the exclusive OR and the exclusive NOR, and the same storage location for the input value having the same multiplication and accumulation value is accessed, thereby reducing the duplication of the memory data to decrease the ROM area.

Note that there can be employed a corresponding number of ROMs to the number of rows f the coefficient matrix in the transform expression of the DCT. In such a case, an address decoder suited to the regularity per row is usable per row. Further, the rows in which the regularity is common are collected, and the multiplication and accumulation data thereof are stored in the ROM in a bank form. Thus, it is also possible to further reduce the circuit area.

It is apparent that, in this invention, a wide range of different working modes can be formed based on the invention without deviating from the spirit and scope of the invention. This invention is not restricted by its specific working modes except being limited by the appended claims.

What is claimed is:

1. A discrete cosine transform processor comprising:
   input means for receiving image data to be processed;
   storage means responsive to a read line for storing multiplication and accumulation values corresponding to the image data and transform matrix components for use in a discrete cosine transform arithmetic so that the same value is read from the same read line, wherein said storage means includes a first storage unit for storing the multiplication and accumulation values corresponding to even-numbered rows of the transform matrix components and a second storage unit for storing the multiplication and accumulation values corresponding to odd-numbered rows of the transform matrix components;

decoding means for selecting the read line, in which the image data includes a plurality of bits representing address data, wherein said decoding means has a first decoder for accessing said first storage unit and a second decoder for accessing said second storage unit, wherein each one of the first decoder and the second decoder includes subdecoders for outputting three address values from two bits of the image data;

accumulating means for accumulating the data read from said storage means; and output means for outputting a result of the accumulation processing as output data.

2. A discrete cosine transform processor according to claim 1, wherein each of said subdecoders includes an exclusive-OR gate, a first AND gate, one input of which is a negated input and a second AND gate, one input of which is a negated input.

3. A system for performing discrete cosine transform of an image data signal, the system comprising:

a memory device, responsive to a read signal, having a first storage unit and a second storage unit, wherein the first storage unit stores transform coefficients of even-numbered rows of a transform matrix and the second storage unit stores transform coefficients of odd-numbered rows of the transform matrix, wherein the same transform coefficients share the same address location so that the same address location in the memory device is accessed by the read signal representing the image data signal having different values;

a decoding device for generating the read signal from the image data signal for accessing the memory device, wherein the decoding device has a first decoder for accessing said first storage unit and a second decoder for accessing said second storage unit, wherein each one of the first decoder and the second decoder comprises a subdecoder which outputs three address values from two bit data of the image data signal;

accumulating means for accumulating the data read from the memory device; and output means for outputting a result of the accumulation processing as an output signal.

* * * * *